US008875389B2

(12) United States Patent
Kan et al.

(10) Patent No.: US 8,875,389 B2
(45) Date of Patent: Nov. 4, 2014

(54) METHOD OF MAKING AN ELECTRICAL CONNECTION SYSTEM

(75) Inventors: Ken Kan, Taipei County (TW); Jeff Chen, Taipei County (TW); Michael Chang, Taipei County (TW)

(73) Assignee: Flextronics AP, LLC, Broomfield, CO (US)

( * ) Notice: Subject to any disclaimer, the term of this patent is extended or adjusted under 35 U.S.C. 154(b) by 549 days.

(21) Appl. No.: 13/289,927

(22) Filed: Nov. 4, 2011

(65) Prior Publication Data

US 2012/0047732 A1 Mar. 1, 2012

Related U.S. Application Data

(62) Division of application No. 12/758,696, filed on Apr. 12, 2010, now Pat. No. 8,096,837.

(51) Int. Cl.

| | |
|---|---|
| ***H05K 3/30*** | (2006.01) |
| ***H01R 31/06*** | (2006.01) |
| ***H01R 13/50*** | (2006.01) |

(52) U.S. Cl.

CPC ............ *H01R 31/06* (2013.01); *H01R 2201/06* (2013.01); *H01R 13/501* (2013.01)

USPC .................. 29/832; 29/825; 29/829; 29/830; 29/840

(58) Field of Classification Search

USPC ............................ 29/825, 829, 830, 832, 840

See application file for complete search history.

(56) References Cited

U.S. PATENT DOCUMENTS

| | | | | |
|---|---|---|---|---|
| 4,335,272 | A | 6/1982 | Pittenger | |
| 5,137,464 | A | 8/1992 | Maue et al. | |
| 6,231,389 | B1 | 5/2001 | Lai | |
| 7,311,526 | B2 | 12/2007 | Rohrbach et al. | |
| 7,442,069 | B2 | 10/2008 | Jing | |
| 7,753,714 | B2 | 7/2010 | Wu et al. | |
| 2005/0082915 | A1 | 4/2005 | Steinberg | |
| 2006/0292931 | A1 * | 12/2006 | Tokuda | 439/607 |
| 2009/0025962 | A1 | 1/2009 | Gelardi | |
| 2011/0250787 | A1 | 10/2011 | Kan et al. | |

OTHER PUBLICATIONS

Office Action mailed on Apr. 24, 2012, U.S. Appl. No. 13/289,919, filed Nov. 4, 2011, applicant: Ken Kan, 9 pages.

Notice of Allowance, U.S. Appl. No. 13/536,803, filed Jun. 28, 2012, applicant Ken Kan, mail date: Apr. 18, 2013, 16 pages.

Examiner-Initiated Interview Summary, Supplemental Notice of Allowability, and Examiner's Amendment, dated Sep. 29, 2011, U.S. Appl. No. 12/758,696, 8 pages.

* cited by examiner

*Primary Examiner* — Carl Arbes

(74) *Attorney, Agent, or Firm* — Haverstock & Owens LLP

(57) ABSTRACT

Systems and methods electrically connect a first electronic device or electrical component, having a external electrical connector, to a circuit board of a second electronic device. A low-cost, user-installable connection system isolates mechanical stresses imposed on the external electrical connector to within the user-installable connection system, thereby preventing the mechanical stresses from reaching the circuit board in the second electronic device. If the connection becomes faulty, only the low-cost, user-installable connection system must be replaced.

20 Claims, 9 Drawing Sheets

METHOD OF MAKING AN ELECTRICAL CONNECTION SYSTEM

RELATED APPLICATIONS

This patent application is a Divisional application which claims priority under 35 U.S.C. 121 of U.S. patent application No. 12/758,696, filed Apr. 12, 2010 entitled "REPLACEABLE CONNECTION FOR PORTABLE ELECTRONIC DEVICES" which is hereby incorporated in its entirety by reference.

FIELD OF THE INVENTION

The present invention relates to the field of external electrical connections to portable electronic devices such as laptop computers, personal digital assistants (PDAs), portable digital music devices, cell phones and other well-known electronic devices. More specifically, the present invention relates to systems and methods of electrically connecting a first electronic device to a circuit board in a second electronic device with a user-replaceable electrical connection.

BACKGROUND OF THE INVENTION

Many of today's portable electronic devices require coupling to another electronic device or an electrical component. One example is coupling an AC/DC power adapter to a laptop computer to supply power to the laptop computer motherboard. Inside the laptop computer, a connector to receive the AC/DC power adapter is soldered to the motherboard of the laptop computer. The connector protrudes from through the laptop computer case, often out of the back of the computer case. The power adapter has a cable with a mating connector to plug into the back of the laptop. Although the power adapter cable is flexible, most cables have a hard, molded plastic end which provides a means for a user to grip the end of the connector. When the power adapter connector is inserted into the back of the laptop computer, the hard molded plastic end of the cable protrudes from the back of the laptop. If the laptop is accidentally tipped backward, the hard molded end of the power adapter cable and its connector are forced upward by the surface upon which the laptop rests. This essentially pries up the corresponding mating connector off of the laptop motherboard. This failure mechanism is shown in FIGS. 1A and 1B. Even one such instance can be enough to cause the solder joints which couple the mating connector to the laptop motherboard to fail electrically and/or mechanically, rendering the power adapter connection inoperable or intermittent. The repair of such a failure is typically outside the skills of the laptop computer user. Further, the repair cost is typically high and the repair time is long, often measured in weeks. Electronic devices with external electrical connectors soldered to their circuit boards can easily incur costly, time consuming failures through normal use.

SUMMARY OF THE INVENTION

Embodiments of the present invention are directed to systems for, and methods of, establishing an external connection to a circuit board in an electronic device. Embodiments of the connection system and housing comprise a low cost module which is easily replaced by a layperson, without special tools or specialized knowledge. The systems and methods substantially reduce the cost and inconvenience of restoring a reliable connection between a first electronic device and a second electronic device. In addition, the systems and methods isolate and localize the mechanical forces exerted on the external connectors, which would otherwise be transferred to the circuit board of the second electronic device. The connection system removably connects to the internal circuit board by any of a wide variety of connector pairs. The internal connector pairs can include flexible ribbon cable connectors, pin-array connectors such as ATA hard disk connectors, Molex connectors, and the like. The external connectors can also be of a wide variety of types including, but not limited to, USB connector pairs, subminiature phone jacks for headphones, Ethernet cables, 15-pin external computer screen connectors, power adapters, IEEE-1394 "Firewire" connectors, and parallel computer cable connectors.

The systems and methods disclosed herein comprise a connection system and optional housing which can localize mechanical and/or electrical failures to the connection system. The connection system and housing are easily and cost-effectively replaced by an end user of the electronic device.

In a first aspect, an electrical connection system comprises a mounting element, an external electrical connector, mechanically coupled to the mounting element, an internal electrical connector electrically coupled to the external electrical connector, wherein the internal electrical connector is configured to be removably, electrically coupled to a first circuit board in an electronic device, and a sacrificial portion configured to fail in a predetermined failure mode when a predetermined minimum failure mode force is applied to the external electrical connector. In some embodiments, the connection system further includes a housing configured to accept the electrical connection system, the housing further configured to be removably, mechanically coupled to the electronic device. The housing is able to be removably, mechanically coupled to the electronic device, and the mounting element comprises the housing. The failure modes are able to be mechanical or electrical failure modes. In some embodiments, the mounting element is a substantially planar surface. The substantially planar surface can include a structurally weakened portion. The structurally weakened portion can be a thinned portion, a scored portion, a slotted portion, a perforated portion, a drilled portion, a brittle portion, or any combination thereof.

In some embodiments, the substantially planar surface comprises a second circuit board, electrically coupled to the external electrical connector. In such embodiments, the internal electrical connector is able to be mechanically coupled to the second circuit board, thereby electrically coupling the second circuit board to the external electrical connector. Alternatively, the internal electrical connector is able to be flexibly, electrically coupled to the first circuit board. In some embodiments the internal electrical connector is mechanically coupled to the substantially planar surface, and the internal electrical connector is flexibly electrically coupled to the external electrical connector. In further embodiments, the substantially planar surface comprises a second circuit board, the internal electrical connector is mechanically and electrically coupled to the second circuit board, thereby electrically coupling the internal electrical connector to the external electrical connector, and the internal electrical connector is removably, flexibly, electrically coupled to the first circuit board. In additional embodiments, the substantially planar surface comprises a second circuit board, and the internal electrical connector is flexibly, electrically coupled to the second circuit board.

In a second aspect, a method of making an electrical connection system comprises mechanically coupling an external electrical connector to a mounting element, electrically coupling an internal electrical connector to the external electrical connector, wherein the internal electrical connector is configured for electrically coupling to the first circuit board, and providing a sacrificial portion configured to fail in a predetermined failure mode when a predetermined minimum failure mode force is applied to the external electrical connector. In some embodiments providing the sacrificial portion comprises providing a sacrificial portion configured to mechanically fail. Mechanically coupling the external electrical connector to the mounting element can include soldering, gluing, epoxying, brazing, welding, encasing, integrally forming, press-fitting, snap-fitting, fastening with threaded fasteners, or any combination thereof.

In some embodiments the sacrificial portion comprises providing a substantially planar mounting element. Providing a substantially planar mounting element can further include providing a substantially planar mounting element with a weakened portion. In such embodiments, providing the substantially planar mounting element with a weakened portion includes thinning, perforating, scoring, drilling, increasing the brittleness of the substantially planar mounting element, or any combination thereof. In some embodiments, electrically coupling an internal connector to the external connector includes coupling the external electrical connector to the mounting element. In such embodiments, providing the sacrificial portion can include providing a sacrificial portion configured to electrically fail. Further embodiments of providing the sacrificial portion configured to electrically fail comprise providing a sacrificial portion configured for the electrical coupling of the external electrical connection to the internal electrical connection to fail.

DETAILED DESCRIPTION OF THE DRAWINGS

Figure 1A:
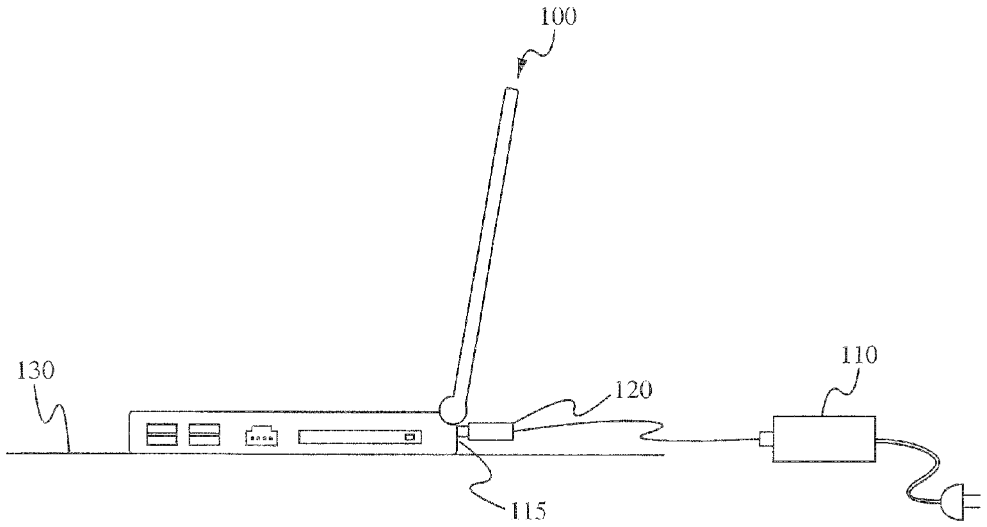
Fig.1A (Prior Art)
FIG. 1A shows a first electronic device coupled to a second electronic device as is known in the art.

Connection systems in accordance with embodiments of the invention enable a user of an electronic device to quickly and easily repair a failed electrical connection inside her electronic device without the need for special skills or tools, and at a low cost. The connection system is a user-replaceable module which houses a sacrificial portion that is designed to fail, thereby avoiding a failure at an internal circuit board inside the electrical device. The connection system removably connects to the circuit board in such a way as to isolate the connectors on the internal circuit board from forces which would cause them to fail. Instead, the external connector, or other element localized to the connection system, is designed to fail. In some embodiments, a single screw is removed, and the connection system is withdrawn by the user. The internal circuit board is designed to fail in one or more predetermined failure modes. Failure modes include mechanical and/or electrical failure of a substantially planar mounting surface in the connection system and mechanical and/or electrical failure of the coupling of the external connector to the internal substantially planar surface or mounting surface. Failure of the mounting connection of the external connector can include failure of the solder joints of a soldered connector, or other mechanical means of coupling the external connector to a mounting surface or mounting element. Other means of mechanical coupling can include glue, epoxy, brazing, welding, encasing, integrally forming, press-fitting, snap-fitting, fastening with threaded fasteners, or fusing or molding the connector.

Common examples of electronic devices coupled by an external connection to another electronic device or electrical component include an AC/DC adapter coupled to a laptop computer, a laptop computer coupled to a digital camera via a USB cable for transferring pictures to or from the digital camera, and a set of headphones coupled to a digital music player. Where the first electronic device is an AC/DC adapter, the complementary electrical connector is able to be any commercially available DC connector such as a 2.1×5.0 mm DC plug. Where the first electronic device is an AC/DC adaptor, the second electronic device is able to be any device which uses an external DC power source to operate the second electronic device or charge a battery within the second electronic device. Examples of such second electronic devices include, but are not limited to, a laptop computer, a portable music player such as an iPod® or iRiver®, a personal digital assistant (PDA), a cell phone, a SmartPhone such as the Apple® iPhone® or the Motorola® Droid, an external hard drive to a laptop computer, an external CD-ROM to a laptop computer, a portable entertainment system ("Boom Box"), a video camera/recorder, a microphone, and portable speakers.

Embodiments of the connection system each have a predetermined failure mode which occurs when a predetermined minimum force ("failure mode force") is applied to the external connector. A failure mode force has a direction and a magnitude which are dependent upon the predetermined failure mode. Example failure modes include mechanical failure of the coupling of the external connector to a mounting surface, mechanical failure of the mounting surface, and failure of the electrical continuity between the external connector and an internal connector. Specific examples of failure modes will be discussed, below, with respect to the specific embodiments in the figures. The embodiments shown exemplify a single predetermined failure mode. One skilled in the art would recognize that multiple failure modes can be combined in a single design.

Throughout the figures, below, identical labels refer to identical or similar elements.

Figure 1B:
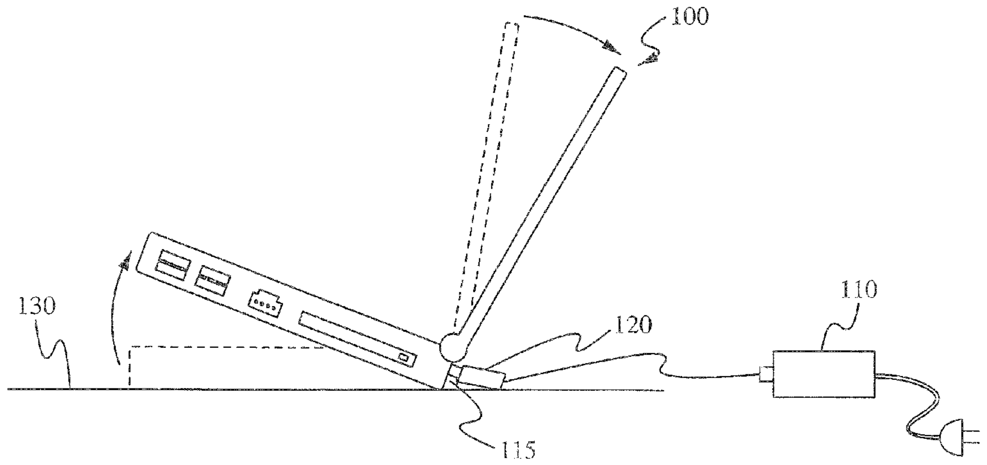
Fig. 1B (Prior Art)
FIG. 1B shows a first electronic device coupled to a second electronic device as is known in the art, showing an example of a typical cause of an electrical coupling failure in an electronic device.

FIG. 1A shows a first electronic device 110 connected to a second electronic device 100 as is known in the art. An example of the first electronic device 110 is an AC/DC power adapter having a complementary electrical connector 120 which a user connects to a mating electrical connector 115 on a laptop computer 100, shown in side view. In normal use, the laptop computer 100 sits on a flat surface 130, such as a table. FIG. 1B shows the laptop computer 100 being accidentally tipped backward from its normal position. When the laptop computer 100 is so tilted, the complementary electrical connector 120 of the power adapter 110 is forced upward by the flat surface 130. The force is multiplied by the distance from the contact point of the complementary electrical connector 120 with the flat surface 130 to the one or more solder joint locations on the motherboard of the laptop computer 100 for the mating connector 115. The force can easily be sufficient to cause the one or more solder joints to fail. The cost and time to repair the defective the solder joints can be substantial.

Figure 2A:
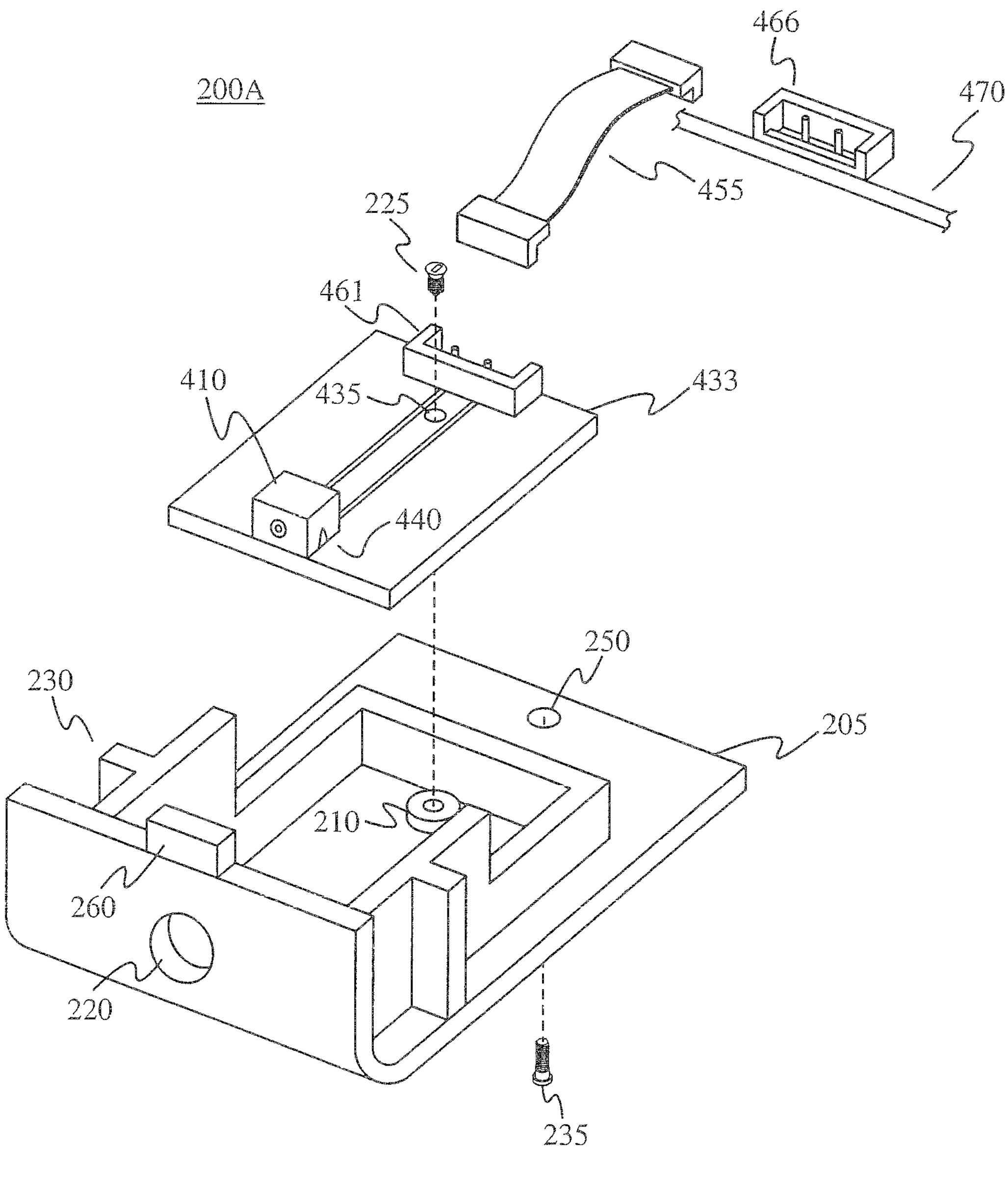
FIG. 2A shows a connection system and housing according to one embodiment.

FIG. 2A is an exploded view of a preferred embodiment of a connection system 200A. The connection system 200A comprises an external electrical connector 410 soldered at one or more points 440 to a substantially planar mounting element 433 that includes a mounting hole 435 at its center. The connection system 200A is removably, electrically coupled to a first circuit board 470 via a flexible electrical conduit 455. The flexible electrical conduit 455 is shown mating to connector 461 on the planar surface 433, which is a second circuit board. The electrical connection from the external connector 410 to the first circuit board 470 is completed when the flexible electrical conduit 455 is coupled to a connector 466 on the first circuit board 470. One skilled in the art will appreciate that the flexible electrical conduit 455 can also be soldered directly to the circuit board 433. Further, the circuit board 433 and flexible electrical conduit 455 can be a single element comprising a flexible circuit wherein a portion of the flexible circuit is mechanically coupled to the planar surface 433 and an extended portion of flexible circuit comprises the flexible electrical conduit 455. Alternatively, the flexible electrical conduit 455 is soldered to the first circuit board 470 and is removably coupled to the internal electrical connector 461 on the circuit board 433. The circuit board 433 is mounted to a housing 205. A threaded fastener 225 couples the circuit board 433 to the housing 205 at the mounting point 210 through the hole 435 in the circuit board 433. The features of the housing 205 can be varied in accordance with the requirements of the electronic device into which the connection system will be installed. (See FIGS. 5A through 5D). The features of the housing 205 shown are exemplary, and not to be construed as limiting. When the circuit board 433 is mounted to the housing 205, access to the external electrical connector 410 is made through the access through-hole 220. A tab feature 260 is able to aid in seating the housing 205 in a fixed position relative to the electronic device (not shown). Guide features 230 on either side of the housing 205 are further able to fix the position of the housing 205. The housing 205 is able to be fixed to the electronic device (not shown) via a threaded fastener 235 through a mounting hole 250.

Figure 2B:
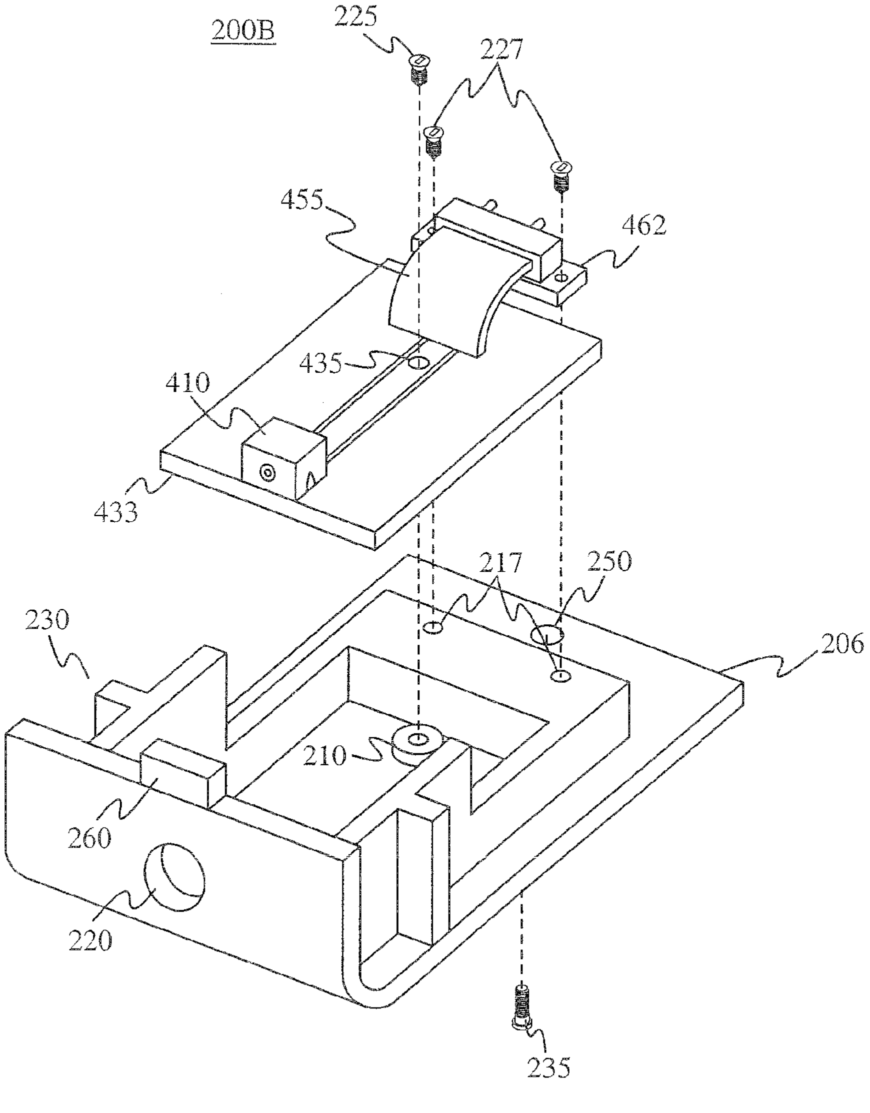
FIG. 2B is an exploded view of a connection system and housing according to one embodiment.

FIG. 2B is an exploded view of a connection system 200B in accordance with one embodiment. As shown in FIG. 2B, an internal electrical connector 462 is mounted to the housing 206 via fasteners 227 through the internal electrical connector mount holes, into the housing mount holes 217. The circuit board 433 has a mounting hole 435 substantially in the center of the circuit board 433, for fastening the circuit board 433 to the housing at mount 210 with a fastener 225. The flexible electrical conduit 455 is coupled to the internal electrical connector 462 and to the circuit board 433. The internal electrical connector 462 connects to a mating connector (not shown) on the motherboard (not shown).

Figure 2C:
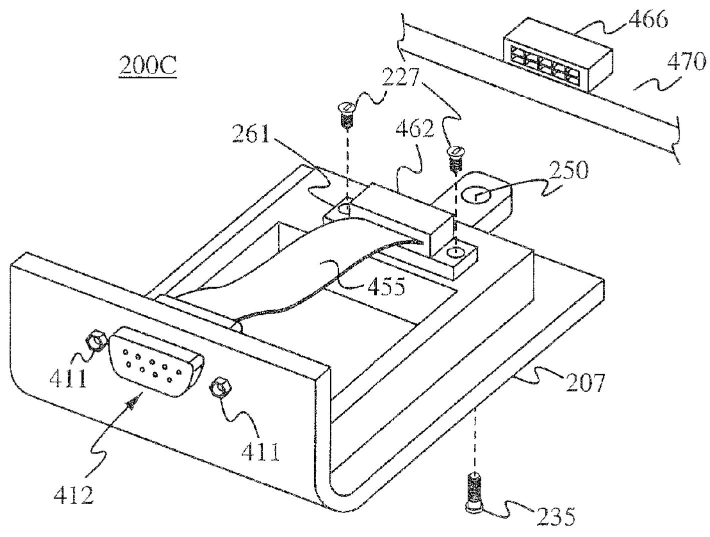
FIG. 2C shows a coupling assembly and housing according to one embodiment.

FIG. 2C shows a connection system 200C in accordance with one embodiment. The connection system 200C has a housing 207 coupled to an external electrical connector 412 via the fasteners 411. The internal electrical connector 462 is coupled to the housing 207 via the threaded fasteners 227 through the mounting holes in the internal electrical connector 462 into mounting holes (not shown) in the housing 207. The internal electrical connector 462 is flexibly, electrically coupled to the external electrical connector 412 by the flexible electrical conduit 455. The housing 207 is coupled to the electronic device (not shown) by the threaded fastener 235 through the mounting hole 250 in the housing 207. When the connection system 200C is coupled to the electronic device (not shown) the connection system 200C is removably, electrically coupled to the motherboard 470 at the internal mating connector 466.

Figure 3:
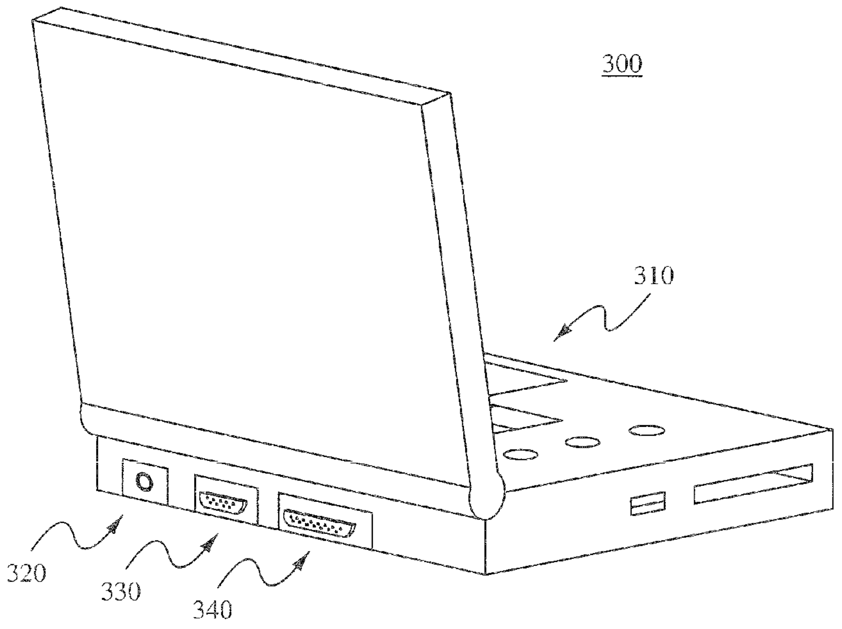
FIG. 3 shows a laptop computer backplane with three systems for electrical connection installed, according to one embodiment.

FIG. 3 shows the backplane of a laptop computer 310 with three electrical connection systems 320, 330, and 340, according to some embodiments. Element 320 is a system for connecting an AC/DC power adapter to the laptop computer 310. Elements 330 and 340 are systems for connecting a first electronic device, such as a monitor or printer, to the laptop computer 310, a second electronic device, according to some embodiments.

Figure 4A:
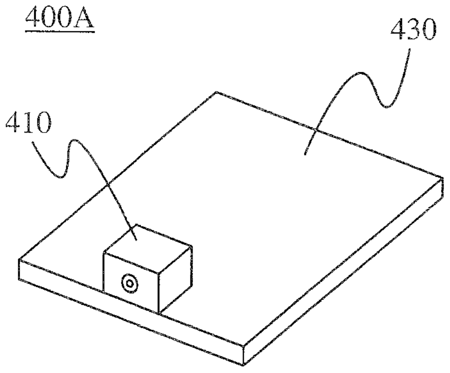
FIG. 4A shows a mounting element according to one embodiment.

FIG. 4A shows a mounting element 400A according to one embodiment. The external electrical connector 410 is able to be mechanically coupled to a substantially planar surface 430. A failure mode force applied to the external electrical connector 410 via an external mating connector 120, similar to the force shown in FIGS. 1A and 1B, causes a failure of the mechanical coupling of the external electrical connector 410 to the substantially planar surface 430. As shown in FIG. 1B, the direction of the force can be perpendicular to the planar mounting surface, upward, and with a minimum magnitude which depends upon the means of mechanical coupling of the external connector to the planar surface. Alternatively, the failure mode force can be parallel to the planar surface 430, and rotational with respect to the external connector such as would twist the connector off of the planar surface. The magnitude of the failure mode force depends upon the means of mechanical coupling of the external connector to the planar surface.

Figure 4B:
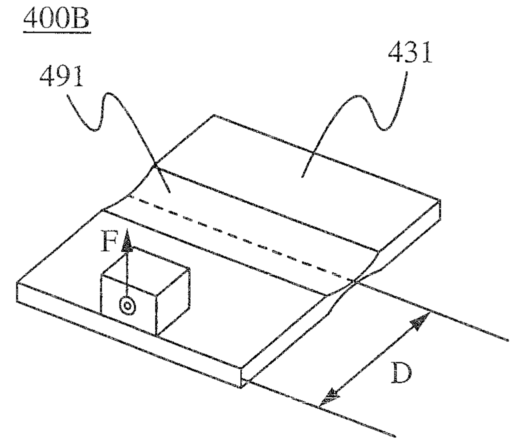
FIG. 4B shows a mounting element having a weakened portion according to one embodiment.

FIG. 4B shows a mounting element 400B having a weakened portion 491 according to one embodiment. The weakened portion 491 is a portion of the substantially planar mounting element 431 wherein the thickness of the substantially planar surface 431 is formed to include the weakened portion 491, so as to enable mechanical failure at the weakened portion 491 when a failure mode force is applied to the external electrical connector, as exemplified in FIGS. 1A and 1B. In this way, the failure mode force is isolated to the connection system. In embodiments where the substantially planar surface 431 comprises a circuit board, described below, the failure mechanism at the weakened portion 491 is further able to include a electrical failure. Mechanical failure of the weakened portion 491 is able to be designed to preclude, or to work in conjunction with, failure of the mechanical coupling of the external electrical connector 410 to the substantially planar surface 431. The weakened portion 491 shown in this embodiment is designed to fail in the presence of a failure mode force which is exerted on the external connector, substantially perpendicular to the planar surface, either upward or downward, such that the weakened portion 491 bends or breaks. The weakened portion 491 can be configured with a longitudinal axis which is perpendicular to the predetermined failure mode force direction, and located at a distance, D, from the failure mode force, F. Thus, a rotational force of F×D is applied to the longitudinal axis of the weakened portion 491. A designer can choose a material and thickness of the weakened portion 491 such that the failure mode will occur when the predetermined failure mode force is applied. One skilled in the art will recognize that, given a specific thickness and material type for the weakened portion 491, that the distance D can be varied to obtain a different predetermined failure mode force.

Figure 4C:
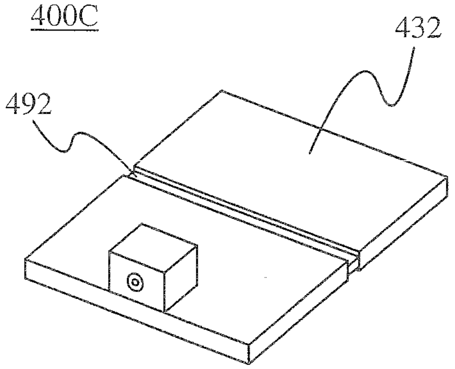
FIG. 4C shows a mounting element having a weakened portion according to one embodiment.

FIG. 4C shows a mounting element 400C having a weakened portion 492 where the thickness of the substantially planar surface 432 has been scored so as to cause mechanical failure at the weakened portion 492 when a failure mode force is applied to the external electrical connector. Where the substantially planar surface 432 further comprises a circuit board, described below, the failure mechanism at the weakened portion 492 is further able to comprise electrical failure. In other embodiments, the weakened portion 492 is able to be perforated, drilled, reduced in density, increased in brittleness, or has another change of physical property designed to facilitate mechanical failure in the weakened portion 492. The weakened portion 492 shown in this embodiment is designed to fail in the presence of a failure mode force which is exerted on the external connector, substantially perpendicular to the planar surface, either upward or downward, such that the weakened portion bends or breaks.

Figure 4D:
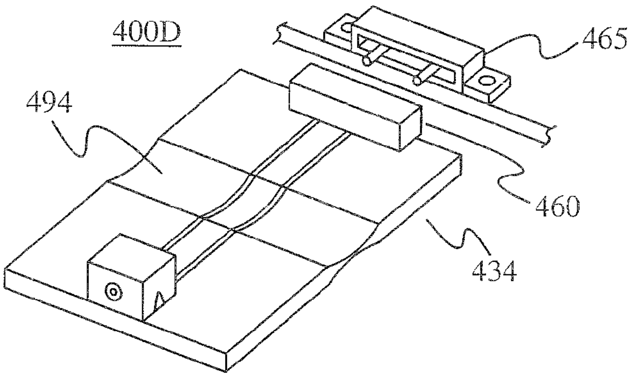
FIG. 4D shows a circuit board as a mounting element having a weakened portion according to one embodiment.

FIG. 4D shows a mounting element 400D having a substantially planar surface 434 with a weakened portion 494. As with the weakened portions described above, the weakened portion 494 is designed to facilitate mechanical failure and, in some embodiments, electrical failure in the substantially planar element when the mounting element 400D is subject to a predetermined failure mode force. The internal electrical connector 460 is mechanically and electrically coupled to the substantially planar surface 434, and in some embodiments is removably, electrically coupled to a connector 465 on a first circuit board inside an electronic device (not shown). The weakened portion 494 shown in this embodiment is designed to fail in the presence of a failure mode force which is exerted on the external connector, substantially perpendicular to the planar surface, either upward or downward, such that the weakened portion 494 bends or breaks. Since the planar surface is also a circuit board in this embodiment, the predetermined failure mode can be both mechanical and electrical. Coincident mechanical and electrical failure is not required. If, for example, the circuit portion of the planar surface is manufactured from a flexible circuit material, and the flexible circuit material is applied with an adhesive to the planar surface, the planar surface can mechanically fail under one failure mode force, and the flexible circuit can electrically fail under a second failure mode force, or not fail electrically at all. If the circuit portion of the planar surface comprises conventional circuit board traces, then the predetermined failure modes can be both electrical and mechanical and the predetermined failure mode force can be the same for both electrical and mechanical failure.

Figure 4E:
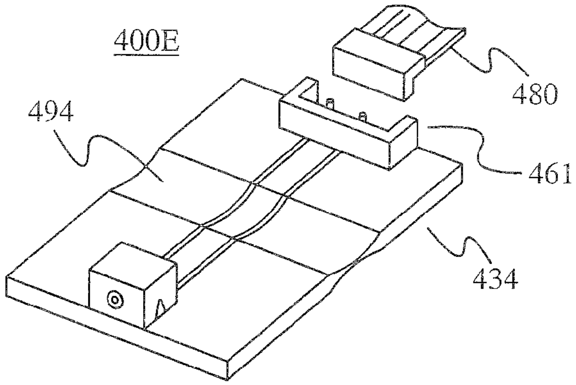
FIG. 4E shows a circuit board as a mounting element having a weakened portion according to one embodiment.

FIG. 4E shows a mounting element 400E having a substantially planar surface 434 with a weakened portion 494. In embodiments according to this figure, the substantially planar surface 434 further comprises a circuit board which includes the weakened portion 494. As with the weakened portions described above, the weakened portion 494 is designed to facilitate mechanical failure and, in some embodiments, electrical failure in the substantially planar surface 434. The internal electrical connector 461 is mechanically and electrically coupled to the circuit board and is removably, flexibly, electrically coupled to a connector (not shown) on a first circuit board (not shown) inside an electronic device (not shown) via a flexible electrical conduit 480. In this preferred embodiment, a connection system comprises a predetermined mechanical and/or electrical failure mode. Further, the connection system is mechanically isolated from the first circuit board (not shown) and the internal connector on the first circuit board (not shown). Mechanical isolation is accomplished by using a flexible electrical conduit 480 to electrically couple the connection system to the first circuit board.

Figure 4F:
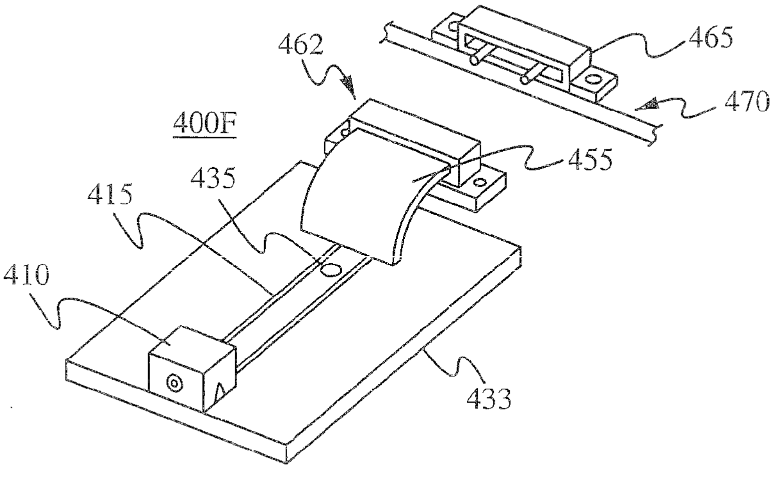
FIG. 4F shows a circuit board as a mounting element according to one embodiment.

FIG. 4F shows a mounting element 400F. In embodiments according to this figure, the substantially planar surface 433 further comprises a circuit board. The internal electrical connector 462 is electrically, flexibly coupled to the circuit board and is thus removably, flexibly, electrically coupled to the connector 465 on a first circuit board 470 inside the housing of an electronic device. A mounting hole 435 facilitates mounting the substantially planar surface to the housing (not shown).

Figure 4G:
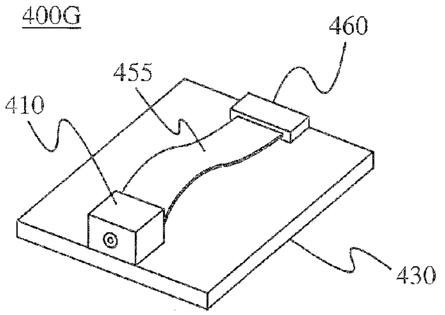
FIG. 4G shows a substantially planar surface as a mounting element wherein the internal electrical connector is mechanically coupled to the substantially planar mounting element and is flexibly electrically coupled to the external electrical connector, according to one embodiment.

FIG. 4G shows a mounting element 400G having the internal electrical connector 460 and the external electrical connector 410 mechanically coupled to the substantially planar surface 430. The internal electrical connecter 460 is flexibly, electrically coupled to the external electrical connector 410 via a flexible electrical conduit 455. In embodiments according to this figure, the failure mechanism is designed to be at the mechanical connection of the external electrical connector 410 to the substantially planar surface 430. If, for example, the external electrical connector 410 is soldered to the planar surface 430, then a predetermined failure mode force applied to the external connector 410 will pry up the solder joints. The failure mode force will not be transmitted to the internal connector 460 because the external connector 410 and the internal connector 460 are mechanically isolated by the flexible electrical conduit 455. Embodiments according to this figure are particularly advantageous because the mounting surface 430 is less expensive than a circuit board and the failure mode does not necessarily result in an electrical failure due to the flexible electrical conduit 455.

Figure 5A:
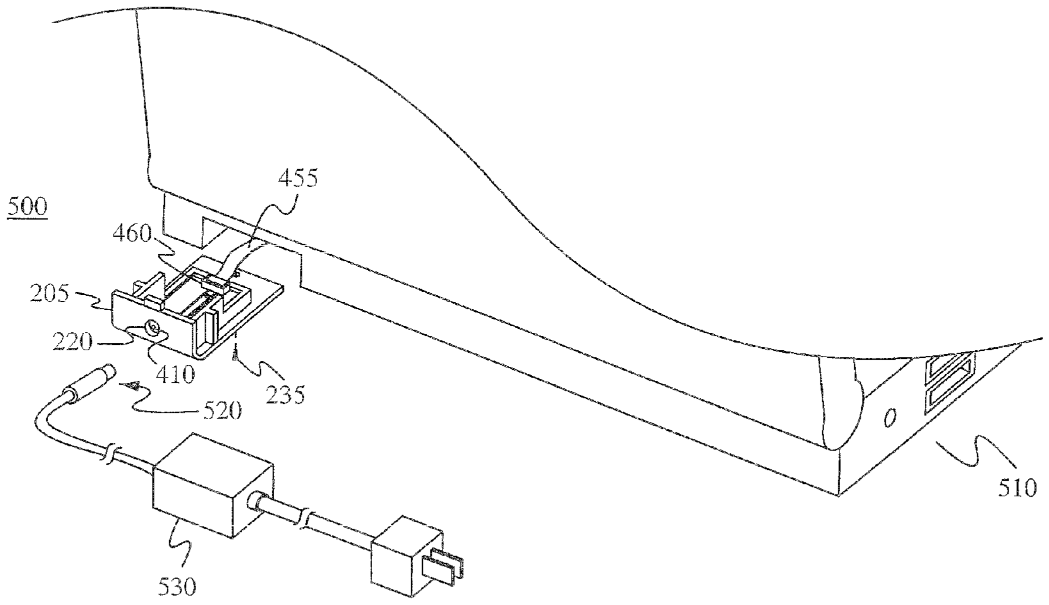
FIG. 5A shows a coupling assembly and housing being installed in a laptop computer according to one embodiment.

FIG. 5A shows a connection system 500 on a laptop computer 510 according to one embodiment. The connection system 500 can be any of the preceding embodiments shown in FIGS. 2A-2C, or other embodiments as would be apparent to one skilled in the art in view of this disclosure. The external electrical connector 410 is accessible by the through-hole 220 in the housing 205 to enable connection of an AC/DC power adapter 530 with a mating connector 520 to the external electrical connector 410. The connection system is flexibly, electrically coupled to the motherboard (not shown) via the flexible electrical conduit 455. For applied to the mating connector 520 of the AC/DC power adapter is transmitted to the external connector 410 inside the connection system 500.

The force is isolated to the connection system 500. If a failure occurs, the failure occurs within the user-replaceable connection system 500.

Figure 5B:
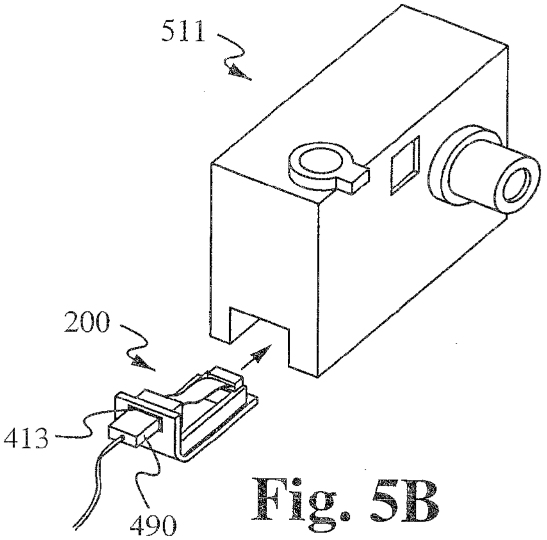
FIG. 5B shows a coupling assembly and housing being installed in a digital camera according to one embodiment.

FIG. 5B shows a connection system 200 on a digital camera 511 according to one embodiment. The connection system 200 can be any of the preceding embodiments shown in FIGS. 2A-2C, or other embodiments as would be apparent to one skilled in the art in view of this disclosure. The external electrical connector 413 comprises a USB connector to receive a USB cable having a mating connector 490. In some embodiments, the external electrical connector is a battery charger for rechargeable batteries in the digital camera 511.

Figure 5C:
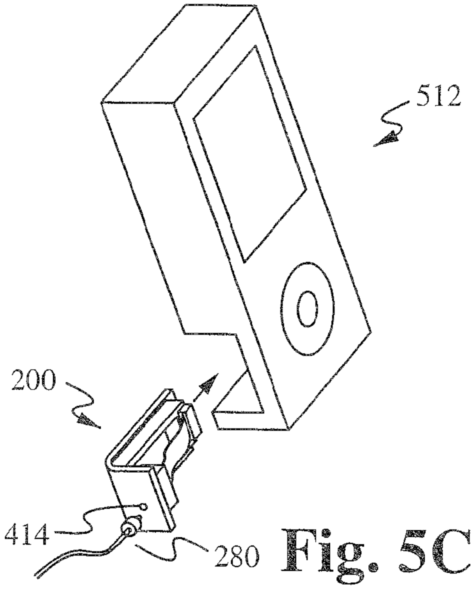
FIG. 5C shows a coupling assembly and housing being installed in a digital music player according to one embodiment.

FIG. 5C shows a connection system 200 being installed in a digital music player 512 according to one embodiment. The connection system 200 can be any of the preceding embodiments shown in FIGS. 2A-2C, or other embodiments as would be apparent to one skilled in the art in view of this disclosure. An external electrical connector 414 includes a sub-miniature phone jack to receive a headphone cable having a mating connector 280. In some embodiments, the external electrical connector 414 comprises a battery charger port for rechargeable batteries in the digital music player 512, or a USB cable for transferring files to and from the digital music player.

Figure 5D:
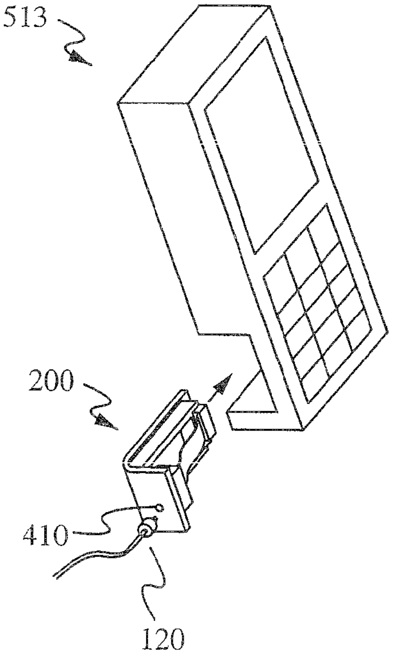
FIG. 5D shows a coupling assembly and housing being installed in a cell phone according to one embodiment.

FIG. 5D shows a connection system 200 being installed in a cell phone 513 according to one embodiment. The connection system 200 can be any of the preceding embodiments shown in FIGS. 2A-2C, or other embodiments as would be apparent to one skilled in the art in view of this disclosure. The external electrical connector 410 comprises a battery charger for rechargeable batteries in the cell phone 513, or a USB cable for transferring files to and from the cell phone.

Figure 6:
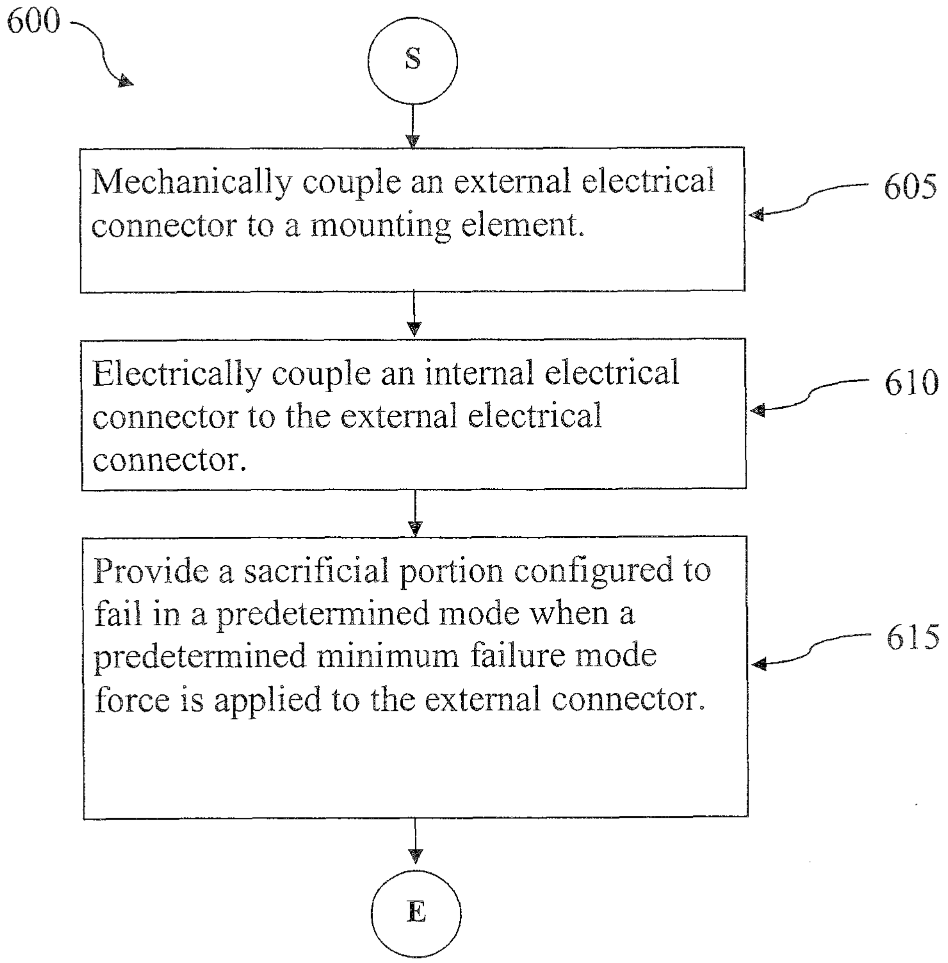
FIG. 6 shows the steps of a method of making a system for external electrical coupling to a first circuit board in an electronic device according to one embodiment.

FIG. 6 shows the steps 600 of a method of making a connection system according to one embodiment. At step 605, an external electrical connector is mechanically coupled to a mounting element, such as a substantially planar surface, a circuit board, or a housing. At step 610, an internal electrical connector is electrically coupled to the external electrical connector such as by a flexible or solid wire, flat ribbon cable, or via traces on a circuit board, or by a direct physical and electrical connection between the external and internal electrical connectors such as by soldering. Next, at step 615, a sacrificial portion is provided which is configured to fail in a predetermined mode when a predetermined minimum failure mode force is applied to the external connector. The failure mode force is the force at which the predetermined failure mode will occur. The magnitude and direction of the failure mode force is determined by the design choice of the failure mode. For example, if the designed failure mode is mechanical failure of the solder joints which couple the external connector to a mounting surface, then the failure mode force is that force which, when applied to the external connector, will cause the solder joints to mechanically yield. If the designed failure mode is a mechanical failure of the substantially planar mounting surface, and the surface is scored as shown in FIG. 4C, then the failure mode force is that minimum force which, when applied to the external connector, will cause the planar mounting surface to mechanically fail at the scored, weakened portion. One skilled in the art will recognize that the failure mode can be designed in view of an anticipated force at the external connector, or a failure mode force at the external connection can be determined from the mechanical failure properties of the substantially planar mounting surface, the dimensions of the surface, and the location of the weakened portion. As discussed in FIGS. 4A through 4G above, the failure mode is able to be a mechanical failure or an electrical failure, or both.

In operation, a method of making an electrical connection system begins with determining at least one failure mode for an external connector on a circuit board in an electronic device. For example, as described in FIG. 1B, given a laptop computer resting on a table, having an AC/DC power adapter connector located on the backplane of the laptop computer, a predetermined failure mode is mechanical and/or electrical failure of the AC/DC power adapter connector when the laptop computer is accidentally tipped backward by the user. The weight of the laptop and the user's accidental tipping force combine to apply a force at the power adapter connector to pry the external connector up off of the internal circuit board. To predetermine a failure mode and associated minimum failure mode force, an engineer would attach a pulling force measuring tool to the power adapter cable connector at the back of the laptop computer, and pull in a predetermined direction until the external connector failed in a predetermined failure mode. If a specific desired failure mode force is known, then an engineer's knowledge of the strength of the materials in the connection system provide a starting point for the connection system design. For example, if a planar mounting surface is to be used, and the size of the surface is known, a weakened portion can be provided in accordance with the known failure mode force. In one specific example, if the failure mode force is 4 pounds, applied at the external connector, 3 inches from the longitudinal axis of a weakened portion of a planar mounting surface, then a 1 foot-pound rotational force is applied at the weakened portion. The designer can choose a planar mounting surface material and a structure for providing a weakened portion in the planar surface material such that the weakened portion mechanically fails when a 1 foot-pound rotational force about the axis of the weakened portion is applied at the external connector.

The present invention has been described in terms of specific embodiments incorporating details to facilitate the understanding of principles of construction and operation of the invention. Such reference herein to specific embodiments and details thereof is not intended to limit the scope of the claims appended hereto. It will be readily apparent to one skilled in the art that other various modifications are able to be made to the embodiments chosen for illustration without departing from the spirit and scope of the invention as defined by the appended claims.

What is claimed is:

1. A method of making an electrical connection system comprising:

a. mechanically coupling an external electrical connector to a mounting element;

b. electrically coupling an internal electrical connector to the external electrical connector, wherein the internal electrical connector is configured for electrically coupling to the first circuit board; and c. providing a sacrificial portion configured to fail in a predetermined failure mode when a predetermined minimum failure mode force is applied to the external electrical connector.

2. The method of claim 1 wherein providing the sacrificial portion comprises providing a sacrificial portion configured to mechanically fail.

3. The method of claim 2, wherein mechanically coupling the external electrical connector to the mounting element comprises soldering, gluing, epoxying, brazing, welding, encasing, integrally forming, press-fitting, snap-fitting, fastening with threaded fasteners, or any combination thereof.

4. The method of claim 1, wherein providing the sacrificial portion comprises providing a substantially planar mounting element.

5. The method of claim 4, wherein providing the sacrificial portion comprises providing a substantially planar mounting element with a weakened portion.

6. The method of claim 5, wherein providing the substantially planar mounting element with a weakened portion comprises thinning, perforating, scoring, drilling, increasing the brittleness of the substantially planar mounting element, or any combination thereof.

7. The method of claim 1 further comprising electrically coupling the external electrical connector to the mounting element.

8. The method of claim 7 wherein providing the sacrificial portion comprises providing a sacrificial portion configured to electrically fail.

9. The method of claim 8 wherein providing the sacrificial portion configured to electrically fail comprises providing a sacrificial portion configured for the electrical coupling of the external electrical connection to the internal electrical connection to fail.

10. A method of making a user-replaceable electrical connection system comprising:

a. coupling an external electrical connector to a mounting element, such that the coupling is configured to fail in a predetermined failure mode in the presence of a predetermined failure mode force applied to the external electrical connector; and b. electrically coupling an internal electrical connector to the external electrical connector.

11. The method of claim 10, wherein coupling the external connector to the mounting element comprises mechanically coupling the external connector to the mounting element.

12. The method of claim 11, wherein the coupling is configured to fail mechanically in a predetermined failure mode in the presence of the predetermined failure mode force applied to the external electrical connector.

13. The method of claim 10, further comprising mechanically coupling the internal connector to the mounting element.

14. The method of claim 10, wherein the electrical coupling comprises coupling the internal and external connector with a flexible electrical conduit.

15. The method of claim 13, wherein the mounting element comprises a circuit board and the electrical coupling comprises mounting the external and internal connectors to the circuit board.

16. The method of claim 10, further comprising coupling the mounting element to a housing configured to receive the mounting element.

17. The method of claim 16, wherein the housing is configured for installation into an electronic device.

18. A method of making an electrical connection system, the electrical connection system comprising a mounting element having a substantially planar portion, the mounting element configured for coupling to an external electrical connector and an internal electrical connector, the mounting element configured to fail in a predetermined failure mode in the presence of a predetermined failure mode force applied to the external connector when the external connector is coupled to the mounting element, the method comprising:

providing the mounting element, the substantially planar surface comprising a weakened portion configured to fail in the presence of the predetermined failure mode force applied to the external connector.

19. The method of claim 18, further comprising coupling the external connector to the mounting element.

20. The method of claim 19, further comprising electrically coupling the internal electrical connector to the external electrical connector.

* * * * *